(12) United States Patent
Thomas

(10) Patent No.: US 10,447,291 B1
(45) Date of Patent: Oct. 15, 2019

(54) HIGH DYNAMIC RANGE ANALOG-TO-DIGITAL CONVERTER

(71) Applicant: Linear Technology Holding, LLC, Norwood, MA (US)

(72) Inventor: Andrew Joseph Thomas, Arlington, MA (US)

(73) Assignee: Linear Technology Holding, LLC, Norwood, MA (US)

(*) Notice: Subject to any disclaimer, the term of this patent is extended or adjusted under 35 U.S.C. 154(b) by 0 days.

(21) Appl. No.: 16/131,792

(22) Filed: Sep. 14, 2018

(51) Int. Cl.
H03M 1/00 (2006.01)
H03M 1/12 (2006.01)
H03M 1/38 (2006.01)

(52) U.S. Cl.
CPC ........... H03M 1/1245 (2013.01); H03M 1/38 (2013.01)

(58) Field of Classification Search
CPC ........ H03M 1/1245; H03M 1/38; H03M 1/12; H03M 1/403
USPC ........................................ 341/155, 172, 122
See application file for complete search history.

(56) References Cited

U.S. PATENT DOCUMENTS

| 4,129,863 | A | 12/1978 | Gray et al. |
|---|---|---|---|
| 4,200,863 | A | 4/1980 | Hodges et al. |
| 5,675,340 | A | 10/1997 | Hester et al. |
| 5,831,562 | A | 11/1998 | Van Auken et al. |
| 6,124,818 | A | 9/2000 | Thomas et al. |
| 6,590,517 | B1 | 7/2003 | Swanson |
| 7,015,841 | B2 | 3/2006 | Yoshida et al. |
| 7,199,745 | B2 | 4/2007 | Tachibana et al. |
| 7,271,758 | B2 | 9/2007 | Piasecki et al. |
| 7,705,765 | B1 | 4/2010 | Yang |
| 7,812,757 | B1 | 10/2010 | Wong et al. |
| 7,961,132 | B1 | 6/2011 | Perry et al. |
| 8,299,952 | B1 | 10/2012 | Lin et al. |
| 8,319,673 | B2 | 11/2012 | Steensgaard-Madsen |
| 8,441,386 | B2 | 5/2013 | Strode |
| 8,456,335 | B2 | 6/2013 | Oshima |

(Continued)

FOREIGN PATENT DOCUMENTS

| CN | 104242935 A | 12/2014 |
|---|---|---|
| CN | 104506195 A | 4/2015 |

(Continued)

OTHER PUBLICATIONS

Aberg, Victor, "Design of 28 nm FD-SOI CMOS 800MS/s SAR ADC for wireless applications", Master's Thesis, University of Gothenburg, Sweden, (2016), 130 pgs.

(Continued)

Primary Examiner — Peguy Jean Pierre
(74) Attorney, Agent, or Firm — Schwegman Lundberg & Woessner, P.A.

(57) ABSTRACT

Techniques to provide automatic-gain ranging for high dynamic range by including a separate S/H capacitor, segmenting the S/H capacitor into a plurality of capacitors, and determining the number of segments to use for a sample. In this manner, the size of the S/H capacitor can be changed (by adjusting the number of capacitors), which can change the amount of input voltage that produces an amount of charge. Using these techniques, the full-scale input range for a sample of the analog input signal can be adjusted automatically based on the magnitude of the sample, which can provide better resolution and/or better noise performance for that particular sample then would otherwise be possible.

20 Claims, 7 Drawing Sheets

(56) References Cited

U.S. PATENT DOCUMENTS

| | | | |
|---|---|---|---|
| 8,730,074 | B1 | 5/2014 | Cowley et al. |
| 8,736,480 | B1 | 5/2014 | Cowley et al. |
| 8,754,799 | B2 | 6/2014 | Coln et al. |
| 8,823,572 | B2 | 9/2014 | Lemkin et al. |
| 8,981,985 | B2 | 3/2015 | Lian et al. |
| 9,432,046 | B1 | 8/2016 | Yu et al. |
| 2004/0140921 | A1* | 7/2004 | Sivard .................. H03M 1/002 341/122 |
| 2006/0055575 | A1* | 3/2006 | Van Tuijl ............ H03M 1/1215 341/155 |
| 2010/0220000 | A1* | 9/2010 | Carreau .............. H03M 1/0673 341/155 |
| 2010/0283643 | A1 | 11/2010 | Byrne et al. |

FOREIGN PATENT DOCUMENTS

| | | |
|---|---|---|
| CN | 105897272 A | 8/2016 |
| CN | 20616450 | 5/2017 |
| DE | 102016112516 | 11/2017 |

OTHER PUBLICATIONS

Analog Devices, "16-Bit, 8-Channel Simultaneous Sampling Data Acquisition System", Analog Devices Data Sheet, (2017), 30 pgs.

Analog Devices, "Buffered Octal, 16-Bit, 200ksps/Ch Differential 10.24V ADC with 30VP-P Common Mode Range", Analog Devices Data Sheet, Analog Devices Data Sheet, (2018), 40 pgs.

Chang, Albert H.T., et al., "Low-Power High-Performance SAR ADC with Redundancy and Digital Background Calibration", PhD Dissertation, MIT, (Jun. 2013), 199 pgs.

Chen, Yanfei, "Yanfei Chen—A Study on Energy-and-Area-Efficient Charge Redistribution Successive Approximation Analog-to-Digital Converters", Dissertation, (Aug. 2010), 114 pgs.

Gomes, Ivanildo Jose P., "Low Power Analog-to-Digital Converter for Visual Prosthesis", INESC-ID / Instituto Superior Técnio, Lisbon, (Oct. 2009), 6 pgs.

Gurleyuk, Cagri, "Analysis of SAR ADC Quantization Nonidealities and Measurement of a 50Vpp Input Range 14Bit 250kS/s SAR ADC", M.Sc. Thesis, Istanbul Technical University, (May 29, 2015), 82 pgs.

Linear Technology, "LTC2345-18: Octal, 18-Bit, 200ksps Differential SoftSpan ADC with Wide Input Common Mode Range", Analog Devices Data Sheet, Linear Technology Corp., (2018), 40 pgs.

Linear Technology, "Octal, 18-Bit, 200ksps Differential 10.24V Input SoftSpan ADC with Wide Input Common Mode Range", Analog Devices Data Sheet, Linear Technology Corp., (2018), 40 pgs.

Ohnhauser, Frank, "ADCs Based on Successive Approximation", Analog-Digital Converters for Industrial Applications Incl. an Intro to Digital-Analog Converters. Springer Vieweg, Berlin, (2015), 51-118.

Sousa, Joe, et al., "Buffered ADC Famiiy Eliminates Signal Conditioning Complexity", Analog Devices Application Note 167, Sep. 2017, 20 pgs.

* cited by examiner

HIGH DYNAMIC RANGE ANALOG-TO-DIGITAL CONVERTER

FIELD OF THE DISCLOSURE

This document pertains generally, but not by way of limitation, to integrated circuits, and more particularly, to analog-to-digital converter circuits and systems.

BACKGROUND

In many electronics applications, an analog input signal is converted to a digital output signal (e.g., for further digital signal processing). For instance, in measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

This disclosure describes, among other things, techniques to provide automatic-gain ranging for high dynamic range by including a separate S/H capacitor (e.g., distinct from the capacitor(s) of a first ADC circuit that will be coupled to a reference voltage or ground during a conversion), segmenting the S/H capacitor into a plurality of capacitors, and determining the number of segments to use for a sample by a preliminary coarse quantization. For example, all segments of the S/H capacitor can be sampled at the same sampling instant and a second circuit, e.g., a coarse ADC circuit, can then make a coarse quantization of the size of the input signal and determine how many segments, e.g., how many sampling capacitors, should be used for this particular conversion. In this manner, the size of the S/H capacitor can be changed (by adjusting the number of capacitors), which can change the amount of input voltage that produces an amount of charge. Using these techniques, the full-scale input range for a sample of the analog input signal can be adjusted automatically based on the magnitude of the sample, which can provide better resolution and/or better noise performance for that particular sample then would otherwise be possible.

In some aspects, this disclosure is directed to a high dynamic range analog-to-digital converter (ADC) circuit configured to convert an analog input signal to a digital signal and automatically determine a number of sampling capacitors to use during a conversion of a sample of the analog input signal based on the analog input signal, the circuit comprising: a first ADC circuit configured to generate the digital signal corresponding to the analog input signal; a plurality of sampling capacitors configured to: receive the analog input signal; and couple to the first ADC circuit. The circuit also comprises a second circuit configured to use the analog input signal to generate an output to select one or more of the plurality of sampling capacitors to couple to the first ADC circuit.

In some aspects, this disclosure is directed to a method of using an analog-to-digital converter (ADC) circuit to automatically determine a number of sampling capacitors to use during a conversion of a sample of an analog input signal based on the analog input signal; the method comprising: receiving the analog input signal using at least one of a plurality of sampling capacitors; generating, using a second circuit, an output to select one or more of the plurality of sampling capacitors to couple to a first ADC circuit; and generating, using the first ADC circuit, a digital signal corresponding to the analog input signal.

In some aspects, this disclosure is directed to a high dynamic range analog-to-digital converter (ADC) circuit configured to convert an analog input signal to a digital signal and automatically determine a number of sampling capacitors to use during a conversion of a sample of the analog input signal based on the analog input signal, the circuit comprising: means for generating the digital signal corresponding to the analog input signal; a plurality of sampling capacitors configured to: receive the analog input signal; and couple to the means for generating the digital signal corresponding to the analog input signal; and means for generating an output to select one or more of the plurality of sampling capacitors to couple to the means for generating the digital signal corresponding to the analog input signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In some approaches, a sampling analog-to-digital converter (ADC) circuit with a sample-and-hold (S/H) capacitor can provide selectable gain/full-scale-range by segmenting its sampling capacitor and using an amount appropriate for the user-supplied gain range. Such an ADC circuit can provide performance advantages in noise, resolution, and linearity over approaches that digitally scale the output code. Although such an ADC circuit can therefore provide a dynamic range improvement, a user may need to anticipate what range is needed for a particular measurement to realize the dynamic range improvement. In some implementations, anticipating a range can be difficult at best.

This disclosure describes techniques to provide automatic-gain ranging for high dynamic range by including a separate S/H capacitor (e.g., distinct from the capacitor(s) of a first ADC circuit that will be coupled to a reference voltage or ground during a conversion), segmenting the S/H capacitor into a plurality of capacitors, and determining the number of segments to use for a sample by a preliminary coarse quantization. For example, all segments of the S/H capacitor can be sampled at the same sampling instant and a second circuit, e.g., a coarse ADC circuit, can then make a coarse quantization of the size of the input signal and determine how many segments, e.g., how many sampling capacitors, should be used for this particular conversion. In some example implementations, the second circuit can be a second ADC circuit while, in other examples, the second circuit can be a range determination logic circuit.

The amount of charge (Q) stored on a capacitor is equal to the capacitance (C) of the capacitor multiplied by the voltage (V) applied to the capacitor (Q=C*V). In other words, the amount of charge on a capacitor is proportional to the size of the capacitor and the input voltage. Using various techniques of this disclosure, a S/H capacitor of an ADC circuit can be segmented into a number N of capacitors and then the total amount of charge on the S/H capacitor is also proportional to the number N. Then, based on a quantization determined by a second ADC circuit, one or more of the N capacitors can be selected to be coupled to a main or first ADC circuit. In this manner, the size of the S/H capacitor can be changed (by adjusting the number of capacitors), which can change the amount of input voltage that produces an amount of charge. Using these techniques, the full-scale input range for a sample of the analog input signal can be adjusted automatically based on the magnitude of the sample, which can provide better resolution and/or better noise performance for that particular sample then would otherwise be possible.

Figure 1:
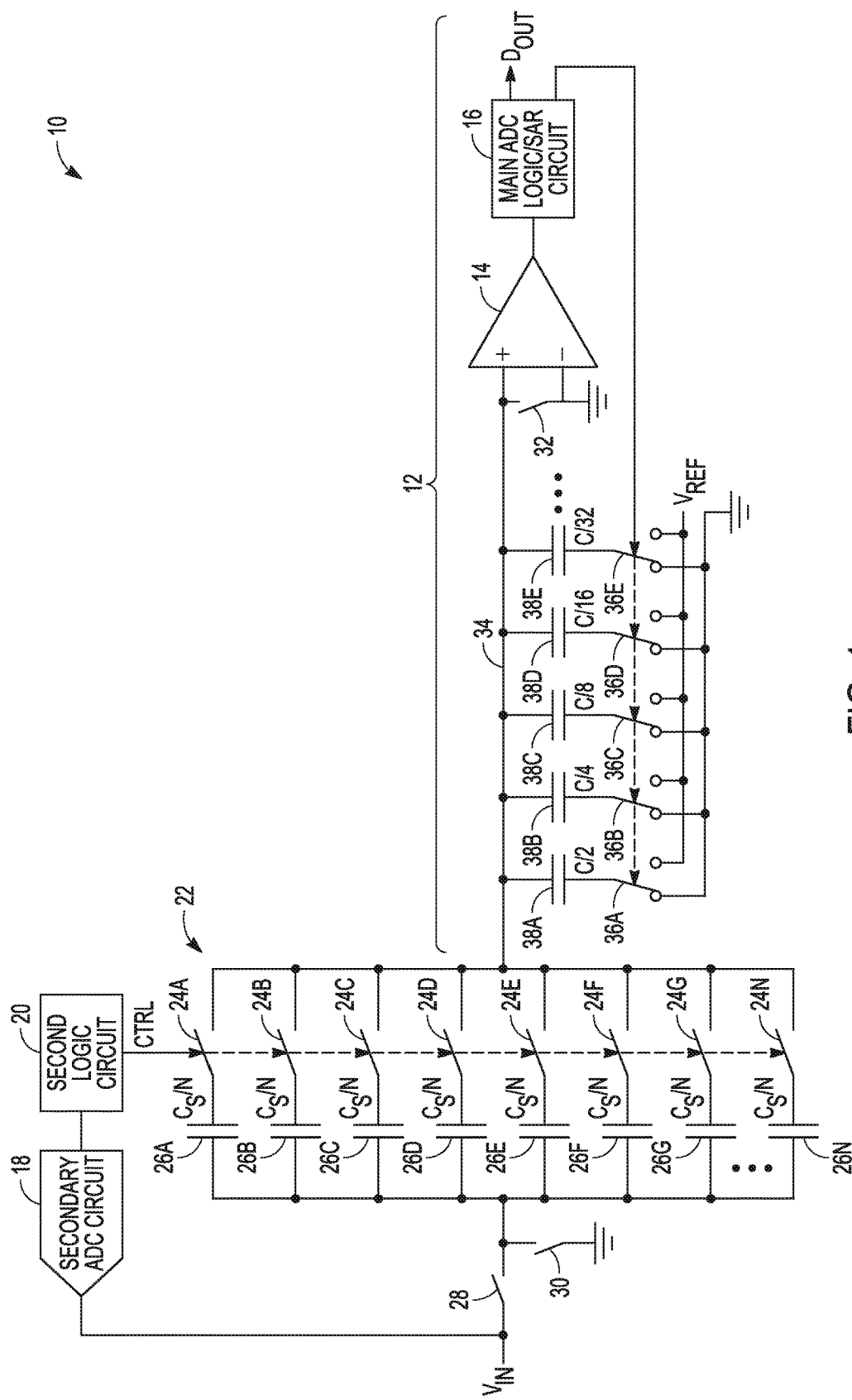
FIG. 1 is a schematic diagram of an example of an ADC circuit that can implement various techniques of this disclosure.

FIG. 1 is a schematic diagram of an example of an ADC circuit that can implement various techniques of this disclosure. The ADC circuit 10 of FIG. 1 can include a main or first ADC circuit 12 including a comparator 14 and a first logic control circuit 16 that can include successive approximation register (SAR) logic circuitry, for example. The first ADC circuit 12 can be configured to generate a digital signal Dout corresponding to an analog input signal $V_{IN}$. The ADC circuit 10 can further include a second ADC circuit 18 coupled to a second logic control circuit 20, and a S/H capacitor segmented into a plurality of N sampling capacitors, thereby forming a S/H capacitor array 22.

Using various techniques of this disclosure, the second ADC circuit 18 can be coupled to the analog input signal $V_{IN}$, quantize the input signal, and based on the quantization determined, the second logic circuit 20 can control one or more switches 24A-24N (collectively referred to as switches 24) to couple a corresponding one or more of the N capacitors 26A-26N (collectively referred to as capacitors 26) to the first ADC circuit 12. By using these techniques, additional capacitors 26 of the S/H capacitor array 22 can be used when a sample of the input signal is less than full scale, which can improve the resolution and/or noise for that particular sample.

While tracking the analog input signal $V_{IN}$, an input switch 28 can be closed, switch 30 can be open, switches 24 can be closed, and switch 32 can be closed. In this configuration, the N sampling capacitors 26 of the S/H capacitor array 22 can be connected between the analog input signal $V_{IN}$ and ground. To take a sample, the first logic control circuit 16 can open the switch 28 and the switch 32, and the secondary ADC circuit 18 can sample the analog input signal $V_{IN}$. At this point, the N sampling capacitors of the S/H capacitor array 22 are floating.

The second ADC circuit 18 can receive the analog input signal $V_{IN}$ and generate a digital output representing the input signal $V_{IN}$ that the second logic circuit 20 can use to control one or more of the switches 24 to select a corresponding one or more of the plurality of sampling capacitors 26 to couple to the first ADC circuit 12. For example, for a full scale analog input signal $V_{IN}$, the second logic circuit 20 can output a control signal CTRL to select the minimum number of switches 24 needed. As the analog input voltage $V_{IN}$ decreases, the second logic circuit 20 can select additional ones of the N sampling capacitors 26.

When the desired number of sampling capacitors 26 of the S/H capacitor array 22 have been selected, the first logic control circuit 16 can close switch 30, thereby coupling the left-hand side of the selected sampling capacitors of the S/H capacitor array 22 to ground. The voltage at the non-inverting terminal of the comparator 14 contains a representation of the analog input voltage $V_{IN}$.

By selecting the number of sampling capacitors 26 to use, the ADC circuit 10 can control the amount of charge coupled from the S/H capacitor array 22 to node 34 when the switch 30 is closed. Less charge can be coupled from the S/H capacitor array 22 for larger input voltage signals $V_{IN}$ and more charge can be coupled from the S/H capacitor array 22 for smaller input voltage signals $V_{IN}$. In this manner, the ADC circuit 10 can control the amount charge sampled onto the node 34, which is coupled to the non-inverting terminal of the comparator 14, and thus can control the scaling of the voltages.

By way of a non-limiting example, if the second ADC circuit 18 determines that, based on the input voltage signal $V_{IN}$, half of the N sampling capacitors 26 of the S/H capacitor array 22 should be used during a conversion of a particular sample, then one-half of the charge of the S/H capacitor array 22 can be coupled onto the node 34 when the switch 30 is closed (assuming that each capacitor 26 of the S/H capacitor array 22 has approximately the same capacitance value). During a conversion, e.g., bit trials during a SAR conversion, the first logic circuit 16 can control various switches 36A-36E to couple selected capacitors 38A-38E of the main or first ADC circuit 12 to a positive reference voltage $V_{REF}$ or to ground, for example, in order to add charge to or remove charge from the node 34. Because only one-half of the charge of the S/H capacitor array 22 was coupled onto the node 34, the digital output Dout can be half-scale when the input voltage $V_{IN}$ equals $V_{REF}*C_S/C$. For the digital output Dout to be full-scale, the input voltage $V_{IN}$ should be equal to $2*V_{REF}*C_S/C$. Thus, for this case where the second ADC circuit 18 determines that half the sampling capacitors N should be used, if $C_S=C$, the attenuation is 2.

With an equally-sized set of N sampling capacitors in the S/H capacitor array 22, e.g., where each of the N capacitors has capacitance $C_S/N$, the attenuations available can correspond to an input range of $N*V_{REF}*C/C_S$. By way of a non-limiting specific example, assume N=32 and that the capacitance $C_S$ of the S/H capacitor array 22 equals the capacitance C of the main or first ADC circuit 12. If one of the 32 sampling capacitors is used, it can correspond to an input range of $32*V_{REF}$. If two of the 32 sampling capacitors are used, it can correspond to an input range of $16*V_{REF}$. If three of the 32 sampling capacitors are used, it can correspond to an input range of $(32/3)*V_{REF}$. And so forth until if 32 of the 32 sampling capacitors are used, it can correspond to an input range of $(32/32)*V_{REF}$, or $1*V_{REF}$. As such, the distribution of input ranges is a function of 1/X, where X is the number of sampling capacitors.

In some example implementations, the second logic control circuit 20 can perform dynamic element matching (DEM). Dynamic element matching techniques, e.g., barrel shifting and the like, can be used to transform into random noise any mismatches among the capacitors 26 of the capacitor array 22.

It should be noted that although FIG. 1 depicts the first ADC circuit 12 as a SAR ADC circuit, the techniques of this disclosure are not limited to SAR ADC circuits. Rather, the techniques of this disclosure can be applicable to pipelined or flash ADC circuits, for example.

Figure 9:
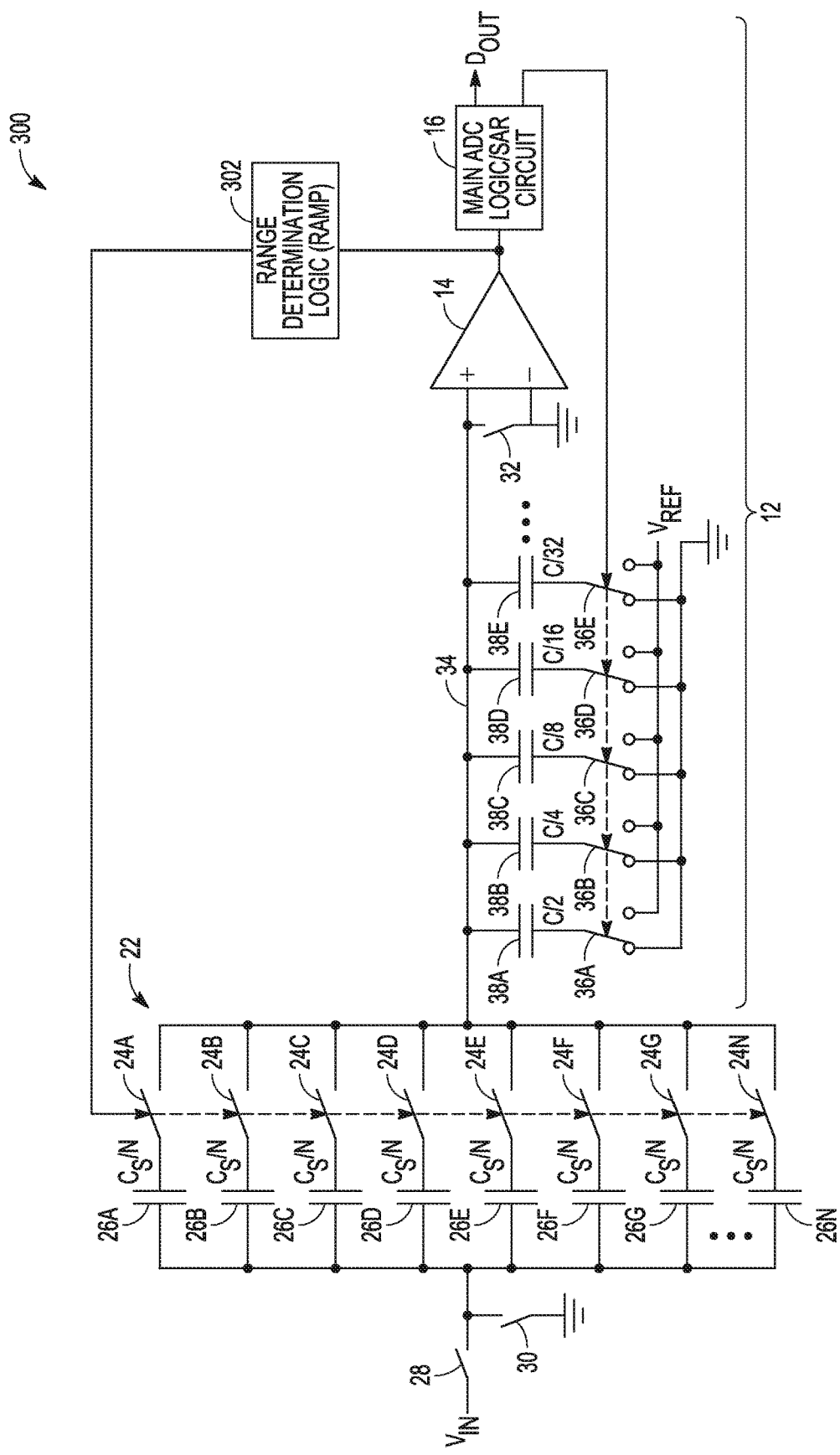
FIG. 9 is a schematic diagram of an example of another ADC circuit that can implement various techniques of this disclosure.

In other example configurations, rather than use a second ADC circuit coupled to the input voltage to determine the number of sampling capacitors to connect, such as shown in FIG. 1, a second circuit, such as a range determination logic circuit, e.g., ramp circuit, can be coupled to an output of the comparator and used to determine the number of sampling capacitors to connect, such as shown in FIG. 9.

Figure 2:
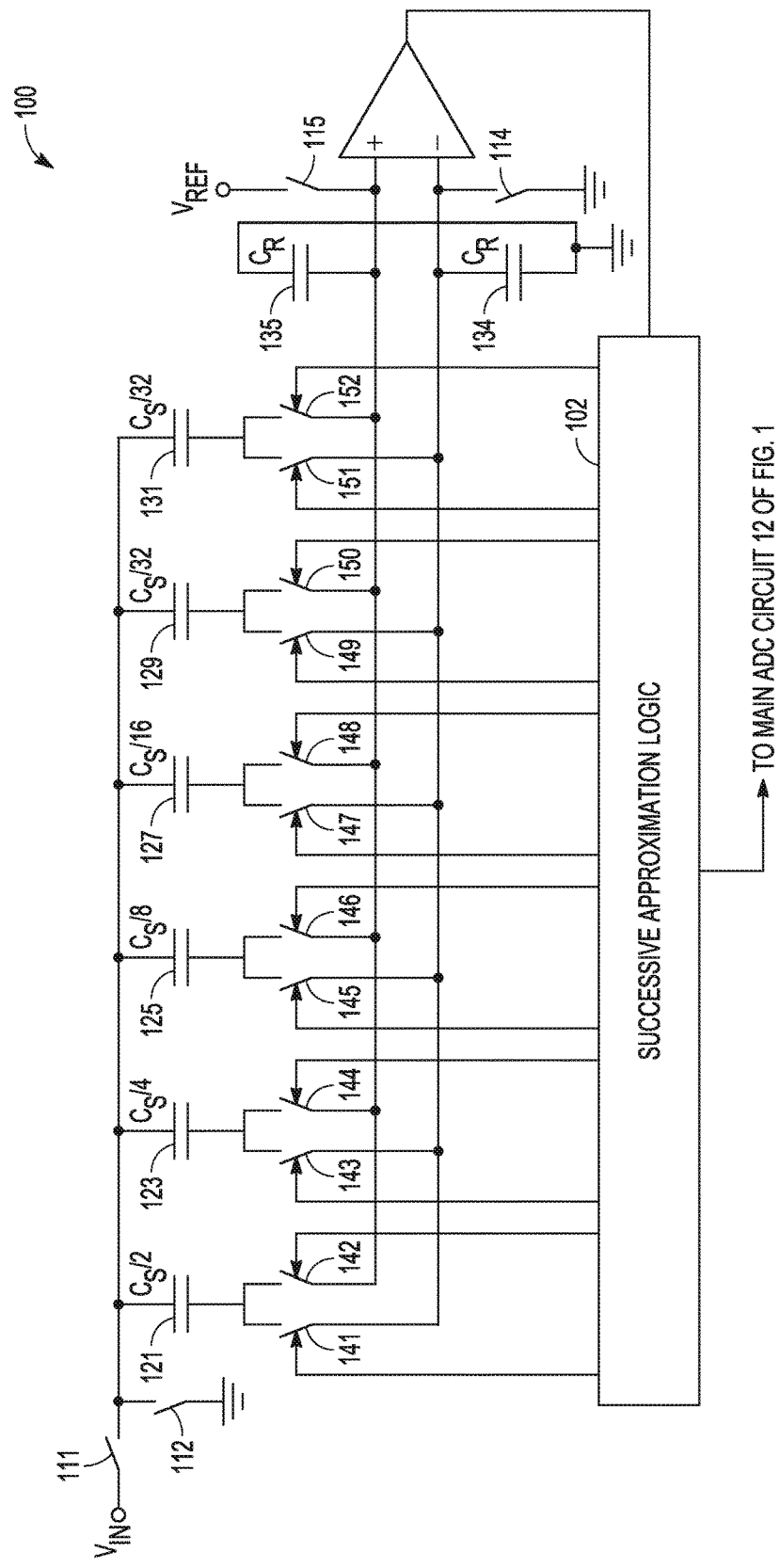
FIG. 2 is an example of the second ADC circuit of FIG. 1 that can be used to implement various techniques of this disclosure.

FIG. 2 is an example of the second ADC circuit 18 of FIG. 1 that can be used to implement various techniques of this disclosure. The second ADC circuit 100 of FIG. 2 can be a SAR ADC circuit including N sampling capacitors 121-131, e.g., binarily weighted capacitors having capacitances of $C_S/2$, $C_S/4$, $C_S/8$, $C_S/16$, $C_S/32$, SAR logic circuit 102, reference capacitors $C_{R1}$ and $C_{R2}$, and a comparator 104.

By way of a non-limiting specific example for purpose of explanation only, assume that the positive reference voltage $V_{REF}$ equals 5V, and that the capacitance of the reference capacitor $C_R$ equals $C_S$. The second ADC circuit 100 of FIG. 2 is configured to operate with $0<Vin<160V$ ($32*V_{REF}$).

While tracking the input, switches 111, 114, 115, 141, 143, 145, 147, 149, 151 are ON (the remaining switches in FIG. 2 are OFF). At the moment the sample is taken, all of these switches open, and the differential input voltage at the comparator 104 is 5V (held on the reference capacitors $C_{R1}$ and $C_{R2}$ 134, 135). Switch 112 then turns ON.

To prepare for a comparison of a first sample, switch 142 turns ON, which makes the comparator differential input voltage zero if $(V_{REF}=(V_{IN}/2))$. If $(V_{REF}-(V_{IN}/2))$ is positive, then $V_{IN}<2*V_{REF}$, and if negative then $V_{IN}>2*V_{REF}$. This decision then controls switches 143, 144: if $V_{IN}<2*V_{REF}$ then switch 144 turns ON, otherwise switch 143 turns ON. With switch 144 ON, the comparator voltage is zero if $V_{REF}=\frac{3}{4}*V_{IN}$ and will be positive if $V_{IN}<4/3*V_{REF}$. With switch 143 ON, the comparator voltage is zero if $V_{REF}=\frac{1}{4}*V_{IN}$, and is positive if $V_{IN}<4*V_{REF}$, and so on.

Ultimately this conversion process can determine X for which $V_{REF}=V_{IN}*(X/32)$. That is, the conversion process can determine how many $\frac{1}{32}^{nds}$ of the input voltage (first or main ADC circuit sample capacitors) can be used to equal the reference voltage (main ADC full scale). The circuit 100 of FIG. 2 can be similar to a normal ADC circuit that would determine $V_{IN}=X/32*V_{REF}$, just the roles of YIN and $V_{REF}$ are swapped. The output of the SAR logic circuit 102, e.g., the output of the second logic circuit 18 of FIG. 1, can be used to control the switches 24 of the S/H capacitor array 22 of FIG. 1.

In addition to an SAR ADC circuit, flash-style ADC circuits can be used to implement the second ADC circuit 18 of FIG. 1. In some examples, the flash-style ADC circuit can utilize capacitors or other capacitive elements, such as shown and described below with respect to FIG. 3. In other examples, the flash-style ADC circuit can utilize resistive elements, such as shown and described below with respect to FIG. 4.

Figure 3:
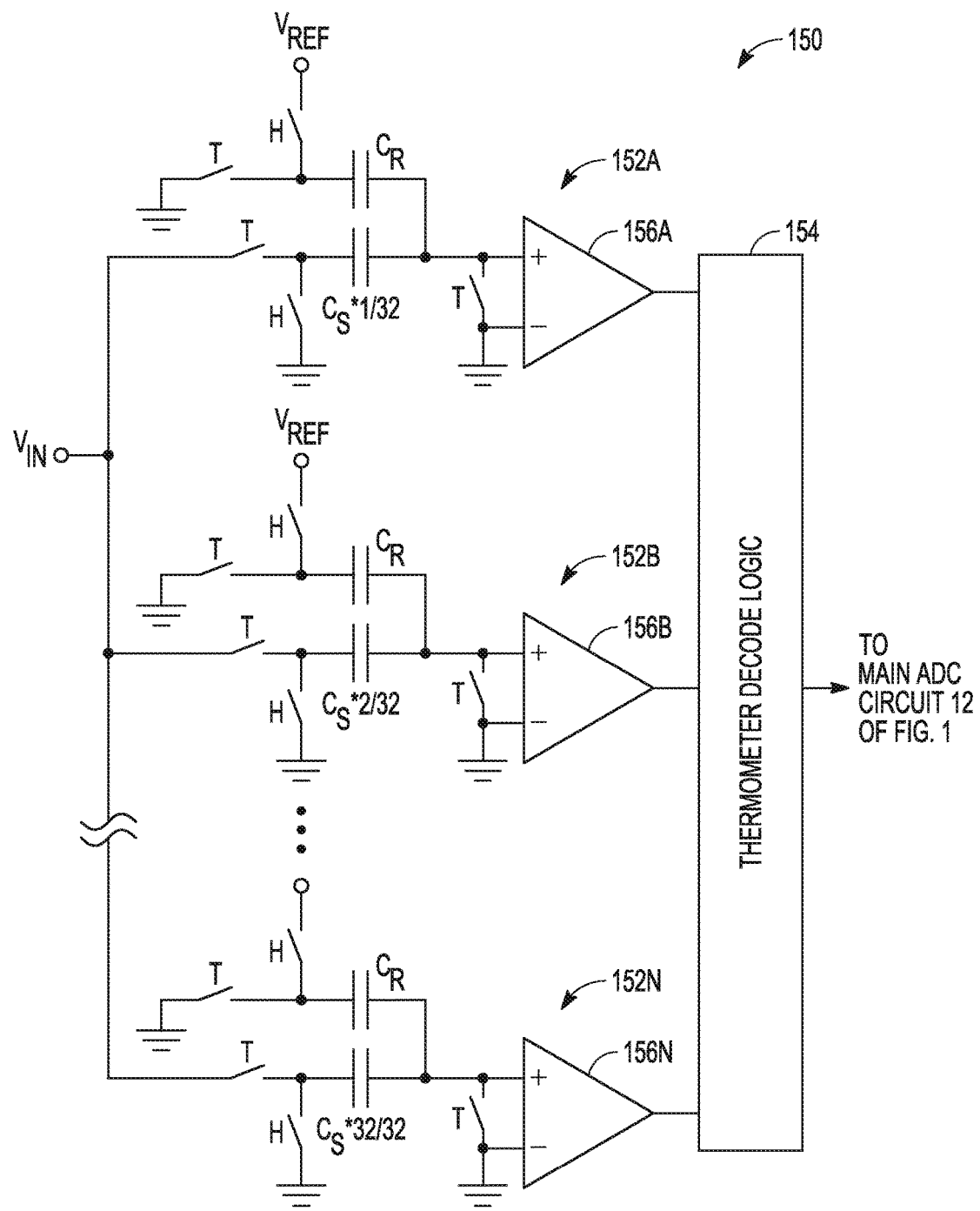
FIG. 3 is another example of the second. ADC circuit of FIG. 1 that can be used to implement various techniques of this disclosure.

FIG. 3 is another example of the second ADC circuit 18 of FIG. 1 that can be used to implement various techniques of this disclosure. The second ADC circuit 150 of FIG. 3 can be a flash-style ADC circuit that can include a plurality of parallel-connected comparator circuits 152A-152N (collectively referred to as comparator circuits 152) having corresponding comparators 156A-156N and can be coupled to a thermometer decode logic circuit 154. In the example shown in FIG. 3, each of the plurality of parallel-connected comparator circuits 152 can include a reference capacitors $C_R$ and a corresponding sampling capacitor $C_S$.

The analog input voltage $V_{IN}$ can be sampled onto many sampling capacitors $C_S$ of the second ADC circuit 150. In the non-limiting example shown in FIG. 3, the input voltage $V_{IN}$ can be sampled onto 32 sampling capacitors $C_S$ having a range of sizes, e.g., $\frac{1}{32}*C_S$, $\frac{2}{32}*C_S$, $\frac{3}{32}*C_S$, and so forth. In parallel, the second logic control circuit, e.g., the second logic control circuit 20 of FIG. 1, can connect each of the 32 sampling capacitors to a set of capacitors, e.g., same-sized reference capacitors $C_R$ that have sampled the reference voltage $V_{REF}$, and can compare the resulting voltage to zero. This flash-style process can produce a thermometer code whose breakpoint indicates how many capacitors should be used in the primary signal path (scaled by the sizing of $C_S$, $C_R$, and the primary signal path capacitances).

In operation, each of the capacitors $C_R$ can be initially grounded on both sides by their corresponding track switches "T". In the hold mode, the left-hand side plate of each capacitor $C_R$ associated with a comparator circuit 152 can be coupled to the reference voltage $V_{REF}$. The sampling capacitor associated with a comparator circuit 152, e.g., capacitor $\frac{1}{32}*C_S$ of comparator circuit 152A, can be switched from being coupled to the input voltage $V_{IN}$ in the track mode to being coupled to ground in the hold mode. In response, the top plate of the associated sampling capacitor can then decrease by some fraction of the input voltage $V_{IN}$. If the input voltage $V_{IN}$ is large, only a small amount of capacitance $C_S$ is needed to counteract the increase due to $C_R$. If the input voltage $V_{IN}$ is small, a larger amount of capacitance $C_S$ is needed to counteract the increase. In the example shown in FIG. 3, the 32 possibilities can be performed in parallel by the comparator circuits 152.

The output of the thermometer decode logic circuit 154, e.g., the output of the second logic circuit 18 of FIG. 1, can be used to control the switches 24 of the S/H capacitor array 22 of FIG. 1.

Figure 4:
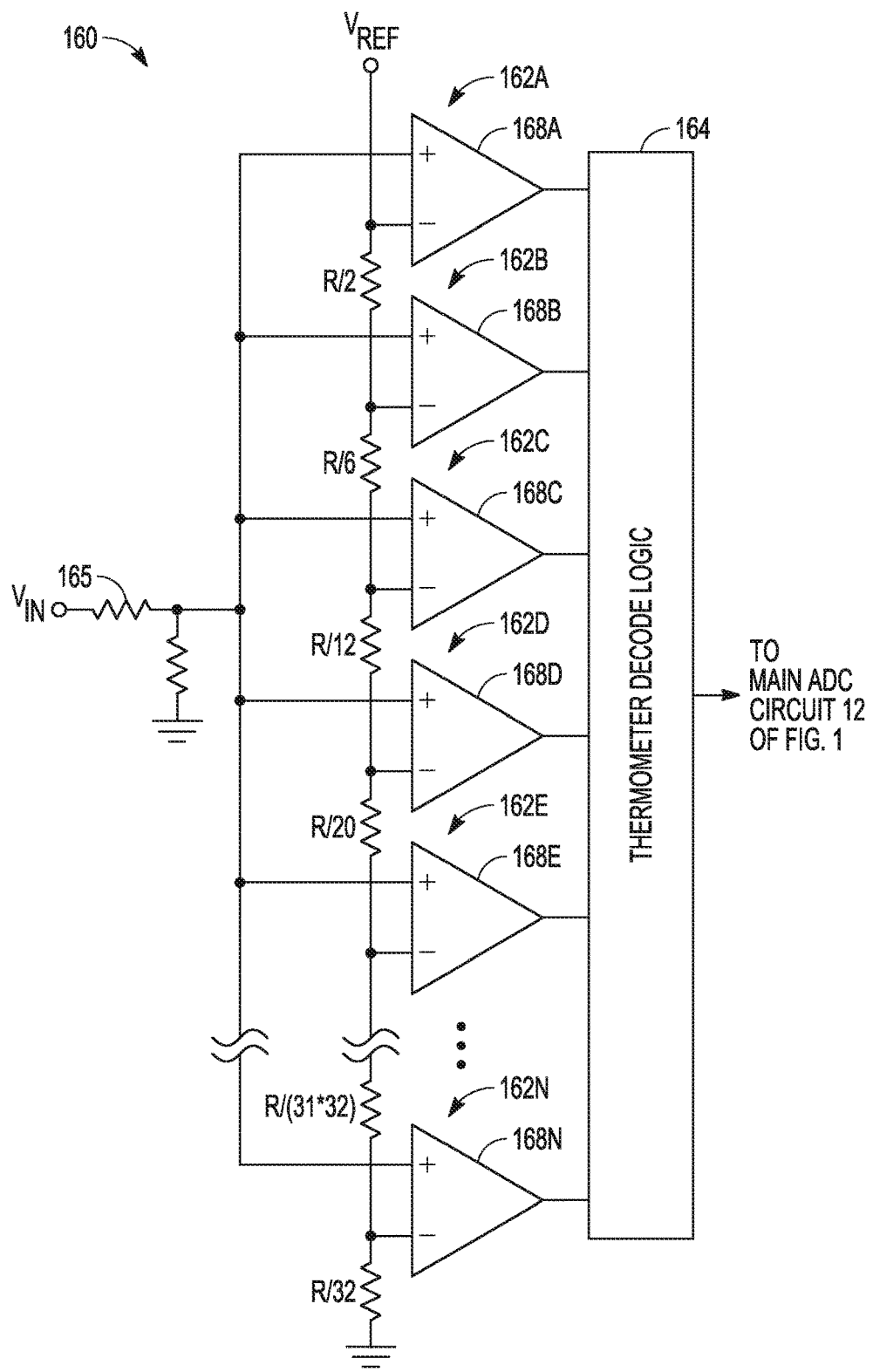
FIG. 4 is another example of the second ADC circuit of FIG. 1 that can be used to implement various techniques of this disclosure.

FIG. 4 is another example of the second ADC circuit 18 of FIG. 1 that can be used to implement various techniques of this disclosure. The second ADC circuit 160 of FIG. 4 can be a flash-style ADC circuit that can include a plurality of parallel-connected comparator circuits 162A-162N (collectively referred to as comparator circuits 162) coupled to a thermometer decode logic circuit 164. In the example shown in FIG. 4, each of the plurality of parallel-connected comparator circuits 162 can be coupled to a corresponding resistor or resistive element, e.g., resistors R/2, R/6, R/12, R/20 . . . . The comparator circuits 162 can compare the fraction of the input voltage $V_{IN}$ produced by resistor divider 165 to a set of thresholds set by the resistive elements in the resistive string 166 from the reference voltage $V_{REF}$.

In contrast to a flash ADC approach in which the resistor values in the string 166 are all equal, e.g., all with a resistance of R, thereby producing evenly spaced thresholds, the resistor values in the resistor string 166 can be chosen to produce thresholds having a 1/X distribution, where X is the number of capacitor in the S/H capacitor array 22 of FIG. 1. All of the resistances in the resistor string 166 of FIG. 4 sum to a resistance R so that the total resistance from the reference voltage $V_{REF}$ to ground is R.

Starting at the top, the top comparator 168A in the string is located at $V_{REF}$. The second comparator 168B is associated with resistor R/2 and is located at $V_{REF}/2$. The third comparator 168C is associated with resistor R/6 and is located at $V_{REF}/3$. Starting at the bottom of the resistor string, the bottom comparator 168N is associated with resistor R/32 and is located at $V_{REF}/32$. The next comparator (not depicted) up in the string is associated with resistor R/(31*32) and is located at $V_{REF}/31$. The next comparator (not depicted) in the string 166 is located at $V_{REF}/30$, and so forth.

The output of the thermometer decode logic circuit 164, e.g., the output of the second logic circuit 18 of FIG. 1, can be used to control the switches 24 of the S/H capacitor array 22 of FIG. 1.

Figure 5:
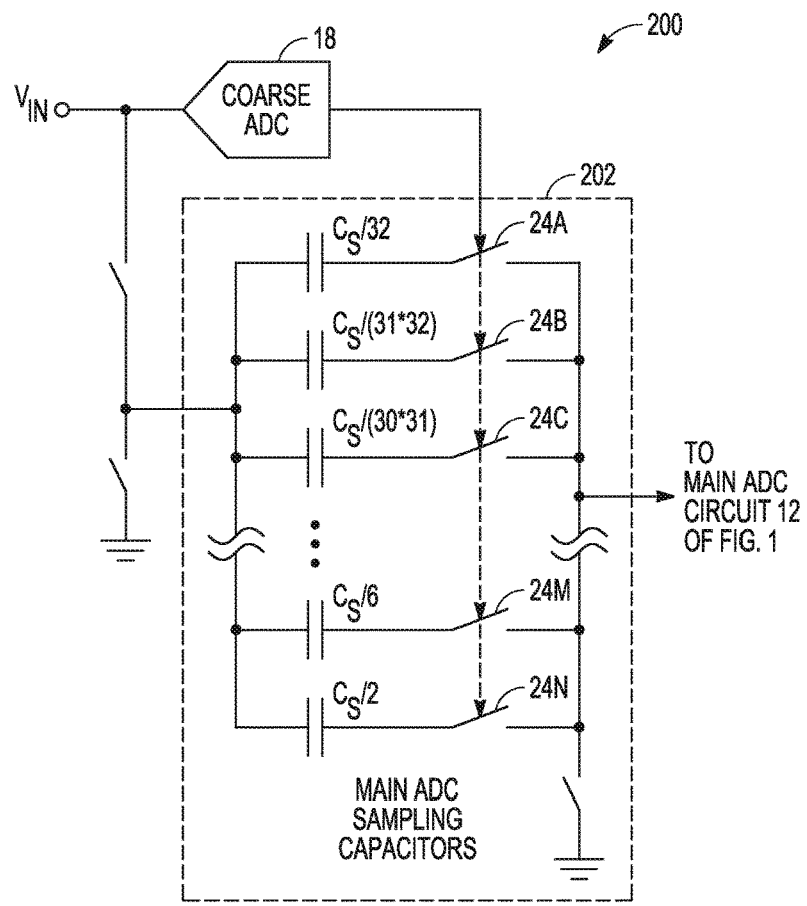
FIG. 5 is a schematic diagram of another example of a portion of an ADC circuit that can implement various techniques of this disclosure.

FIG. 5 is a schematic diagram of another example of a portion of an ADC circuit that can implement various techniques of this disclosure. The ADC circuit 200 of FIG. 5 can include a second or coarse ADC circuit 18, e.g., flash ADC circuit or SAR ADC circuit, and a capacitor array 202 segmented into a plurality of N sampling capacitors. As described above, the second ADC circuit 18 can receive the analog input signal $V_{IN}$ and generate a digital output that can control one or more of the switches 24A-24N of the S/H capacitor array 202 to select a corresponding one or more of the plurality of sampling capacitors to couple to a first ADC circuit, e.g., first ADC circuit 12 of FIG. 1, and perform a conversion to determine a digital output signal Dout, as described above with respect to FIG. 1.

In the example shown in FIG. 5, the capacitors in the S/H capacitor array 202 (in the primary signal path) can be sized in a non-uniform way so that the available combinations of capacitors match the reciprocals of linearly distributed input thresholds. For example, a non-uniform sizing can include capacitors sized such as $C_S$, $C_S*[(32/31)-1]$, $C_S*[(32/30)-(32/31)]$ . . . $C_S*[(32/1)-(32/2)]$ that can be used in a simple thermometer-coded fashion to correspond to linearly distributed thresholds from 0 to a reference voltage.

As described below with respect to FIGS. 6 and 7, in some example implementations, a transformation can be performed in the digital domain in order to account for the scaling between the capacitors of the S/H capacitor array, e.g., the S/H capacitor array 22 of FIG. 1, and the resistors or capacitors of the second ADC circuit, e.g., the second ADC circuit 18 of FIG. 1.

Figure 6:
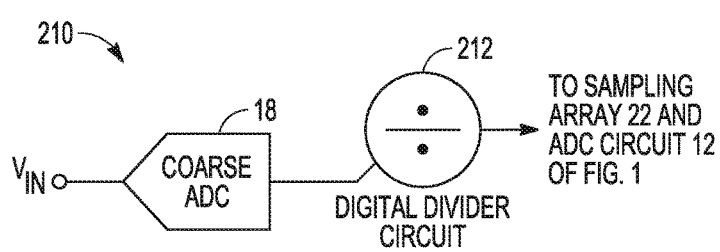
FIG. 6 is a block diagram of another example of a portion of an ADC circuit that can implement various techniques of this disclosure.

FIG. 6 is a block diagram of another example of a portion of an ADC circuit that can implement various techniques of this disclosure. The ADC circuit 210 of FIG. 6 can include a second or coarse ADC circuit 18, e.g., flash ADC circuit or SAR ADC circuit. As described above, the second ADC circuit 18 can receive the analog input signal $V_{IN}$ and generate a digital output that can control one or more of the switches 24 of the S/H capacitor array 22 of FIG. 1 to select a corresponding one or more of the plurality of sampling capacitors to couple to the first ADC circuit 12 of FIG. 1.

In some example configurations, the second ADC circuit 18 of FIG. 6 can be a linear ADC circuit having equal-sized elements, e.g., resistive elements or capacitive elements. Then, a digital divider circuit 212 can perform a computation, e.g., digital division, to the result of the second ADC circuit 18 before application to the primary signal path capacitors of the S/H capacitor array 22 of FIG. 1. In this manner, the digital divider circuit 212 can perform the 1/X computation to account for the distribution of input ranges, rather than performing the transformation in the analog domain with the sizing of the capacitors of the S/H capacitor array 22 of FIG. 1.

Figure 7:
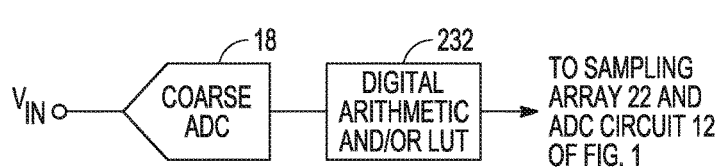
FIG. 7 is a block diagram of another example of a portion an ADC circuit that can implement various techniques of this disclosure.

FIG. 7 is a block diagram of another example of a portion an ADC circuit that can implement various techniques of this disclosure. The ADC circuit 230 of FIG. 7 can include a second or coarse ADC circuit 18, e.g., flash ADC circuit or SAR ADC circuit. As described above, the second ADC circuit 18 can receive the analog input signal $V_{IN}$ and generate a digital output that can control one or more of the switches 24 of the S/H capacitor array 22 of FIG. 1 to select a corresponding one or more of the plurality of sampling capacitors to couple to the first ADC circuit 12 of FIG. 1.

The second ADC circuit 18 of FIG. 7 can be a linear or a non-linear ADC circuit having resistive elements or capacitive elements. Then, a digital logic circuit 232, e.g., digital arithmetic circuit or look-up table, can perform a computation or look-up, using the output of the second ADC circuit 18 before application to the primary signal path capacitors of the S/H capacitor array 22 of FIG. 1. In this manner, the digital logic circuit 232 can perform the appropriate computation or mapping to the result of the second ADC circuit 18 to account for the distribution of input ranges, rather than performing the transformation in the analog domain with the sizing of the capacitors of the S/H capacitor array 22 of FIG. 1 and/or the sizing of the elements in the second ADC circuit 18.

Figure 8:
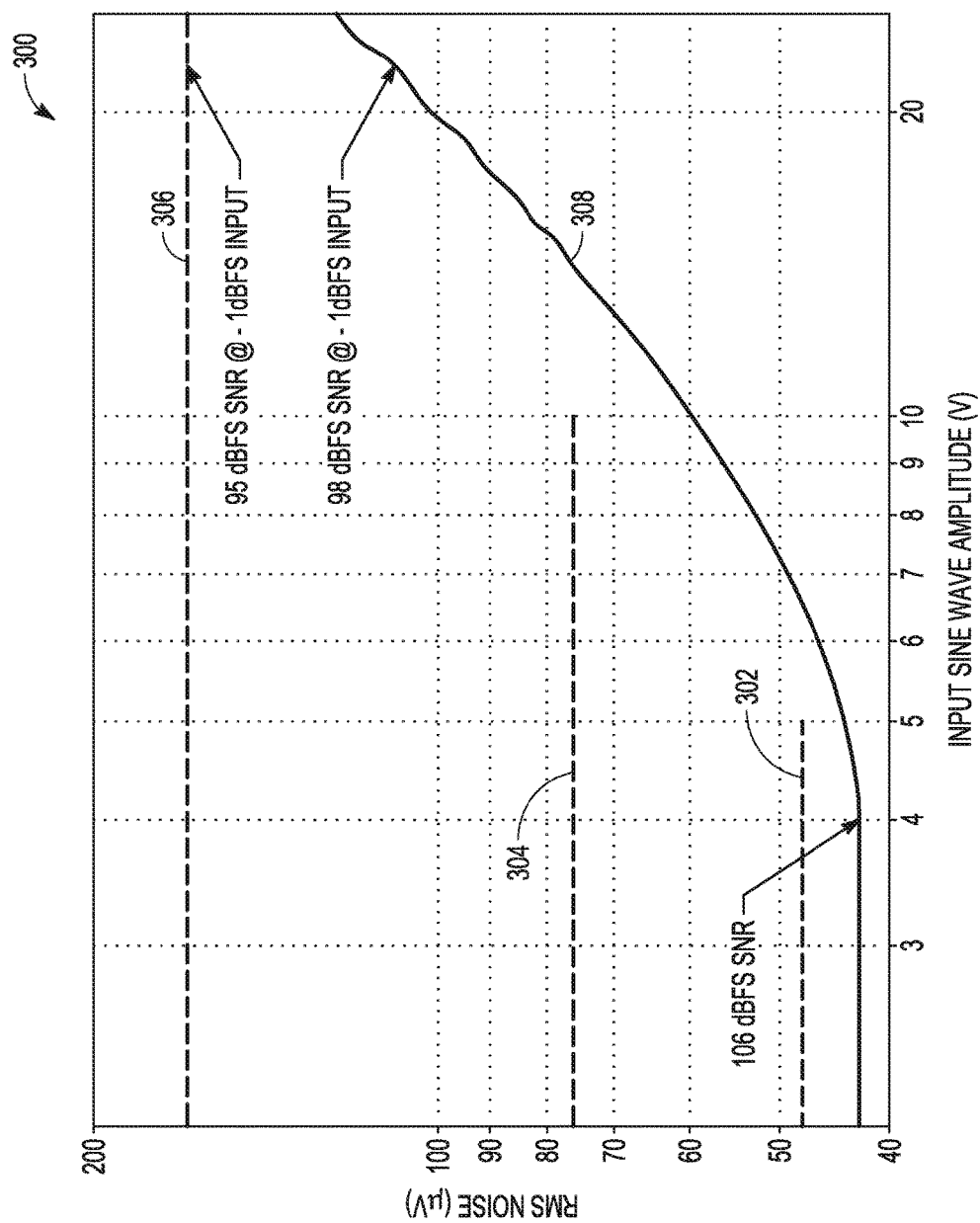
FIG. 8 is a graph depicting a comparison between the high dynamic range techniques of this disclosure and fixed range approaches for equivalent ADC circuits.

FIG. 8 is a graph depicting a comparison between the high dynamic range (HDR) techniques of this disclosure and fixed range approaches for equivalent ADC circuits. The x-axis in FIG. 8 represents the amplitude in volts of an input sine wave and the y-axis represents the RMS noise in microvolts. The graph 300 of FIG. 8 compares the HDR techniques of this disclosure against various fixed range approaches including a fixed 5V range approach 302, a fixed 10V range approach 304, and a fixed 26 range approach 306.

As seen in FIG. 8, the HDR approach 308 has lower RMS noise at 5V over the fixed 5V range 302 approach, has lower RMS noise at 10V over the fixed 10V range approach 304, and has lower RMS noise at 26V over the fixed 26 range approach 306. Further, at lower voltages, e.g., less than 5V, the HDR technique 308 shows a large improvement in noise performance over the fixed range approaches, including the fixed 5V range approach.

In other example configurations, rather than use a second ADC circuit coupled to the input voltage to determine the number of sampling capacitors to connect, such as shown in FIG. 1, a second circuit, such as a range determination logic circuit, e.g., ramp circuit, can be coupled to an output of the comparator and used to determine the number of sampling capacitors to connect, such as shown in FIG. 9.

FIG. 9 is a schematic diagram of an example of another ADC circuit that can implement various techniques of this disclosure. The ADC circuit 300 of FIG. 9 can include a main or first ADC circuit 12 including a comparator 14 and a first logic control circuit 16 that can include successive approximation register (SAR) logic circuitry, for example. The first ADC circuit 12 can be configured to generate a digital signal Dout corresponding to an analog input signal $V_{IN}$. The ADC circuit 300 can further include a second circuit 302 coupled to an output of the comparator 14 and to a S/H capacitor segmented into a plurality of N sampling capacitors, thereby forming a S/H capacitor array 22.

While tracking the analog input signal $V_{IN}$, an input switch 28 can be closed, switch 30 can be open, switches 24 can be closed, and switch 32 can be closed. In this configuration, the N sampling capacitors 26 of the S/H capacitor array 22 can be connected between the analog input signal $V_{IN}$ and ground. To take a sample, the logic control circuit 16 can open the switch 28 and the switch 32, and then close switch 30.

The range determination logic circuit 302, e.g., ramp, can control a first one of the switches 24, e.g., switch 24A, to close and connect one of the capacitors 26, e.g., capacitor 26A, to the first ADC circuit 12. The first ADC logic circuit 16 can control various switches 36 to set the DAC of the first ADC circuit 12 to a voltage Vref/2. If the comparator output is negative, the range determination logic circuit 302 can determine that one (1) is the correct number of capacitors to use and the first ADC circuit 12 can proceed with a conversion using the single connected capacitor of the array 22, e.g., capacitor 26A. If the comparator output is positive, the range determination logic circuit 302 can determine that Vin*2/N*$C_S$/C is less than the voltage Vref and, as such, the number of capacitors 26 should be at least two (2).

If the comparator output was positive, the range determination logic circuit 302 can control another switch 24 to close to couple another capacitor $C_S$/N, close switch 24B to connect capacitor 26B, to the first ADC circuit 12 and can set the first ADC circuit 12 to a voltage of (⅔)*Vref (or a close approximation thereof). If the comparator output is negative, the range determination logic circuit 302 can determine that two (2) is the correct number of capacitors to use and the first ADC circuit 12 can proceed with a conversion using the two connected capacitors of the array 22, e.g., capacitors 26A, 26B. If the comparator output is positive, the range determination logic circuit 302 can determine that the number of capacitors 26 should be at least three (3).

If the comparator output was positive, the range determination logic circuit 302 can control another switch 24 to close to couple another capacitor $C_S$/N, e.g., close switch 24C to connect capacitor 26C, to the first ADC circuit 12 and can set the first ADC circuit 12 to a voltage of (¾)*Vref. In this manner, the range determination logic circuit 302 can continue comparing the output of the comparator 14 to determine the correct number of capacitors 24 to couple to the first ADC circuit 12.

In another example implementation, one capacitor of the array 22 can be coupled to the first ADC circuit 12 and the first logic circuit 16 can perform multiple bits worth of quantization of the comparator input voltage and can update the number of connected capacitor units accordingly. In some examples, the first logic circuit 16 can perform iterations on that step before continuing on with the main conversion. This can be achieved, for example, using a flash-type conversion of the comparator input voltage by operating the pre-existing DAC in a successive-approximation approach, etc.

In some implementations, it may be desirable to use digital arithmetic to map between the distribution of input capacitors and the distribution of the multi-bit thresholds, such as described above with respect to various secondary ADC circuit configurations.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37

The claimed invention is:

1. A high dynamic range analog-to-digital converter (ADC) circuit configured to convert an analog input signal to a digital signal and automatically determine a number of sampling capacitors to use during a conversion of a sample of the analog input signal based on the analog input signal, the circuit comprising:
a first ADC circuit configured to generate the digital signal corresponding to the analog input signal;
a plurality of sampling capacitors configured to:
receive the analog input signal; and
couple to the first ADC circuit; and
a second circuit configured to use the analog input signal to generate an output to select one or more of the plurality of sampling capacitors to couple to the first ADC circuit.

2. The ADC circuit of claim 1, wherein the second circuit configured to use the analog input signal to generate an output to select one or more of the plurality of sampling capacitors to couple to the first ADC circuit includes:
a second ADC circuit configured to receive the analog input signal and generate the output to select one or more of the plurality of sampling capacitors to couple to the first ADC circuit.

3. The ADC circuit of claim 2, wherein the second ADC circuit includes a successive approximation register (SAR) ADC circuit.

4. The ADC circuit of claim 2, wherein the second ADC circuit includes a plurality of parallel-connected comparator circuits.

5. The ADC circuit of claim 4, wherein each of the plurality of parallel-connected comparator circuits includes a corresponding resistance element.

6. The ADC circuit of claim 5, wherein resistance values of the resistance elements have unequal values.

7. The ADC circuit of claim 4, wherein each of the plurality of parallel-connected comparator circuits includes at least one corresponding capacitive element.

8. The ADC circuit of claim 2, wherein capacitance values of the plurality of sampling capacitors have unequal values.

9. The ADC circuit of claim 2, wherein the first ADC circuit includes a successive approximation register (SAR) ADC circuit.

10. The ADC circuit of claim 2, further comprising:
a first logic circuit configured to be coupled to the plurality of sampling capacitors and to perform dynamic element matching on at least some of the plurality of sampling capacitors.

11. The ADC circuit of claim 2, further comprising:
a digital logic circuit coupled to an output of the second ADC circuit and coupled to plurality of sampling capacitors, the digital logic circuit configured to perform a digital computation to the output of the second ADC circuit.

12. The ADC circuit of claim 1, wherein the first ADC circuit includes a pipelined ADC circuit.

13. A method of using an analog-to-digital converter (ADC) circuit to automatically determine a number of sampling capacitors to use during a conversion of a sample of an analog input signal based on the analog input signal, the method comprising:
receiving the analog input signal by at least one of a plurality of sampling capacitors;
generating, by a second circuit, an output to select one or more of the plurality of sampling capacitors to couple to a first ADC circuit; and
generating, by the first ADC circuit, a digital signal corresponding to the analog input signal.

14. The method of claim 13, wherein the second circuit is a second ADC circuit, the method further comprising:
receiving, by the second ADC circuit, the analog input signal,
wherein generating, by the second circuit, the output to select one or more of the plurality of sampling capacitors to couple to the first ADC circuit includes:
generating, by the second ADC circuit, the output to select the one or more of the plurality of sampling capacitors to couple to the first ADC circuit.

15. The method of claim 14, wherein generating, by the second ADC circuit, the output to select the one or more of the plurality of sampling capacitors to couple to the first ADC circuit includes:
performing, by the second ADC circuit, a successive approximation register (SAR) operation on the analog input signal.

16. The method of claim 14, comprising:
performing dynamic element matching on at least some of the plurality of sampling capacitors.

17. The method of claim 13, wherein generating, by the first ADC circuit, a digital signal corresponding to the analog input signal includes:
performing, by the first ADC circuit, a successive approximation register (SAR) operation on the analog input signal.

18. A high dynamic range analog-to-digital converter (ADC) circuit configured to convert an analog input signal to a digital signal and automatically determine a number of sampling capacitors to use during a conversion of a sample of the analog input signal based on the analog input signal, the circuit comprising:
means for generating the digital signal corresponding to the analog input signal;
a plurality of sampling capacitors configured to:
receive the analog input signal; and
couple to the means for generating the digital signal corresponding to the analog input signal; and
means for generating an output to select one or more of the plurality of sampling capacitors to couple to the means for generating the digital signal corresponding to the analog input signal.

19. The ADC circuit of claim 18, wherein the means for generating an output to select one or more of the plurality of sampling capacitors to couple to the means for generating the digital signal corresponding to the analog input signal includes:

means for performing an analog-to-digital conversion to generate the output to select the one or more of the plurality of sampling capacitors.

20. The ADC circuit of claim 18, wherein the means for performing the analog-to-digital conversion to generate the output to select the one or more of the plurality of sampling capacitors includes:
  means for performing a successive approximation register (SAR) operation on the analog input signal.

* * * * *